United States Patent [19]

Kazama et al.

[11] 4,226,491
[45] Oct. 7, 1980

[54] ELECTRONIC DEVICE HAVING A PRINTED CIRCUIT BOARD UNIT THEREIN

[75] Inventors: Kazuo Kazama, Kawasaki; Akira Oka; Masayoshi Shigihara, both of Tokyo; Sueo Shinbashi, Yokohama, all of Japan

[73] Assignee: Fujitsu Limited, Japan

[21] Appl. No.: 33,896

[22] Filed: Apr. 27, 1979

[30] Foreign Application Priority Data

Apr. 28, 1978 [JP] Japan .......................... 53/58960[U]

[51] Int. Cl.³ .............................................. H05K 1/07
[52] U.S. Cl. ........................... 339/17 LM; 339/110 R; 361/399
[58] Field of Search ............. 339/17 R, 17 L, 17 LM, 339/17 M, 17 N, 45 M, 66 M, 110 R; 361/391, 392, 395, 396, 399; 206/334, 328; 220/306

[56] References Cited

U.S. PATENT DOCUMENTS

| | | | |
|---|---|---|---|
| 2,976,510 | 3/1961 | Blain | 339/17 LM |
| 3,641,482 | 2/1972 | Bretting | 339/17 F |
| 3,668,476 | 6/1972 | Wrabel et al. | 361/395 |
| 3,825,110 | 7/1974 | Halbich et al. | 220/306 |
| 3,937,946 | 2/1976 | Weber | 339/17 R |
| 4,011,940 | 3/1977 | Neal et al. | 220/306 |
| 4,030,850 | 6/1977 | Hyde | 220/306 |
| 4,138,711 | 2/1979 | Bremenour et al. | 361/399 |

Primary Examiner—Neil Abrams
Attorney, Agent, or Firm—Staas & Halsey

[57] ABSTRACT

An electronic device comprising a printed circuit board unit contained in a protective cover, and which also serves as a guide member when the electronic device is inserted into a mounting chassis. The cover is constructed from a member formed in one piece, the member having cover portions and flexible hinge portions for permitting the cover portions to be pivotally moved with respect to each other between open and closed positions of the cover. The printed circuit board unit has a printed circuit board which is integrally formed at respective opposed ends with an electrical connector and a handle, which both project out of the cover. Such construction is simple and inexpensive to manufacture.

8 Claims, 8 Drawing Figures

U.S. Patent  Oct. 7, 1980  Sheet 1 of 3  4,226,491
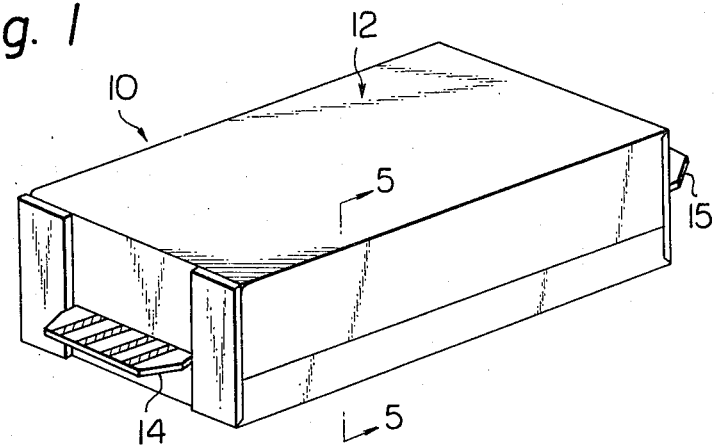
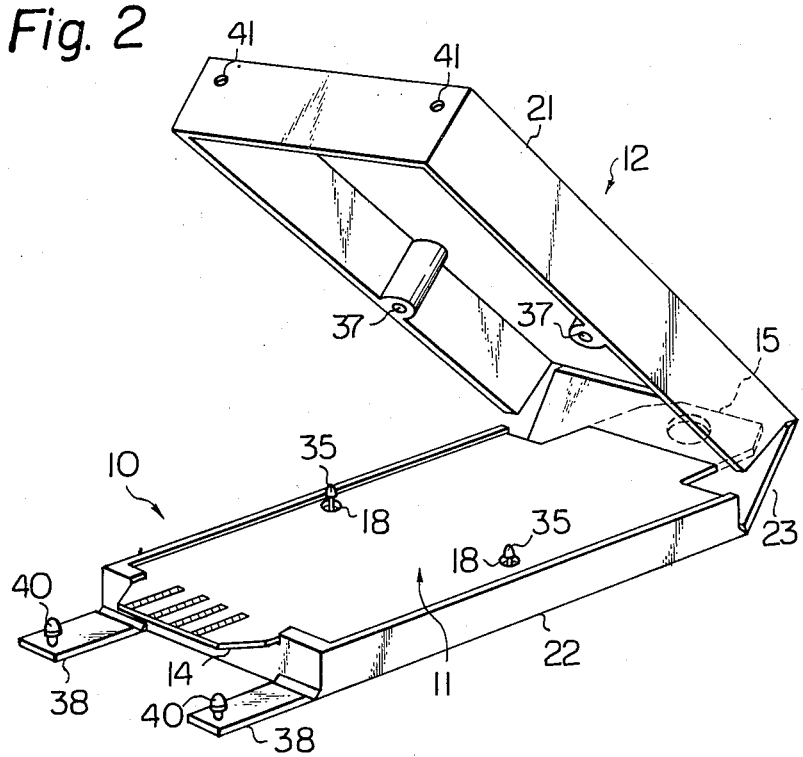

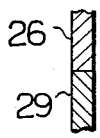
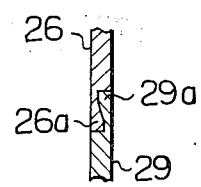
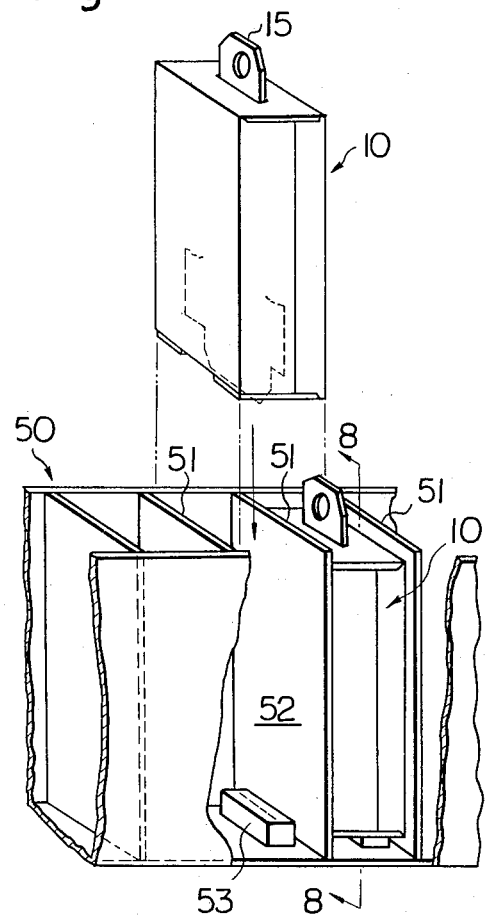
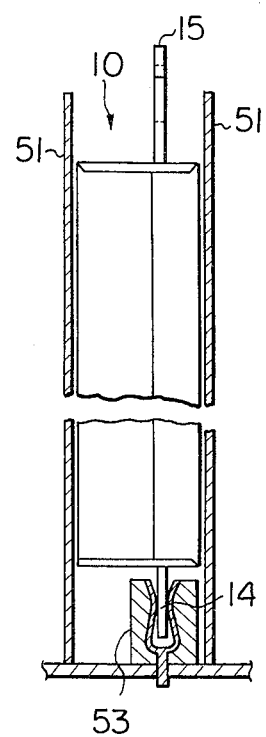

1

ELECTRONIC DEVICE HAVING A PRINTED CIRCUIT BOARD UNIT THEREIN

BACKGROUND OF THE INVENTION

This invention relates to an electronic device having a printed circuit board unit therein and, in particular, to a device of the type in which the printed circuit board unit is contained in a cover, such as a repeater of a carrier transmission system, for example.

The electronic device of the type defined above is, when being used, set in a mounting chassis which is commonly installed in an underground hole, a shelter or the like. The printed circuit board unit is provided at one end of a printed circuit board with an electrical connector which is projected out of the cover. When the electronic device is inserted into the mounting chassis, the electrical connector of the electronic device is brought into engagement with the corresponding electrical connector disposed at the mounting chassis, thereby providing the electrical connection for the printed circuit board unit. The cover is adapted to also serve as a guide member when the electronic device is inserted into the mounting chassis, for ensuring a smooth engagement of the electrical connector. The cover is usually provided with a handle used for the engagement and disengagement of the electrical connector.

With the electronic device of the above defined type, various constructions are known. For example, a relatively convenient construction is disclosed in "Technical Manual Lynch 303RU01, 303RU02 Repeaters", produced by Lynch Communication System Inc., February 1977. However, even in this convenient construction, the cover is constructed from several separate elements which are assembled together with the printed circuit board unit by means of fastening screws. This construction is complicated, requires a large number of steps to fabricate and assemble and, accordingly, is expensive to manufacture.

SUMMARY OF THE INVENTION

It is, therefore, a primary object of the present invention to provide a new and improved electronic device of the above defined type which is relatively simple in construction and inexpensive to manufacture.

A specific object of the present invention is to provide an electronic device of the above defined type which is constructed from a minimum number of separate elements.

In a preferred form of the present invention, the cover is constructed from a member which is formed of a single piece of plastic material. This cover member has cover portions, flexible hinge portions for permitting the cover portions to be pivotally moved with respect to each other between open and closed positions of the cover, and locking portions adapted for retaining the cover portions in the closed position. The printed circuit board unit has a printed circuit board which is integrally formed with an electrical connector of edge type at one end and with a handle at the opposite end.

Such construction is relatively simple and minimizes the number of fabricating and assembling steps, thereby resulting in a low manufacturing cost.

BRIEF DESCRIPTION OF THE DRAWINGS

The present invention will become more apparent from the following description of a preferred embodiment with reference to the accompanying drawings, in which:

FIG. 1 is a perspective external view of an embodiment of the electronic device according to the present invention;

FIG. 2 is a perspective view of the device illustrated in FIG. 1, with the cover being partially opened;

FIG. 5 is a cross sectional view taken through a part of the cover along the line 5—5 in FIG. 1;

FIG. 6 is a partial cross sectional view similar to FIG. 5, but illustrating another embodiment of the cover;

FIG. 7 is a partially excluded perspective view illustrating a manner of setting the electronic device illustrated in FIG. 1 into a mounting chassis, and;

FIG. 8 is a partially excluded longitudinal cross sectional view taken along the line 8—8 in FIG. 7, illustrating the electronic device set in the mounting chassis.

DESCRIPTION OF THE PREFERRED EMBODIMENT

Figure 3:
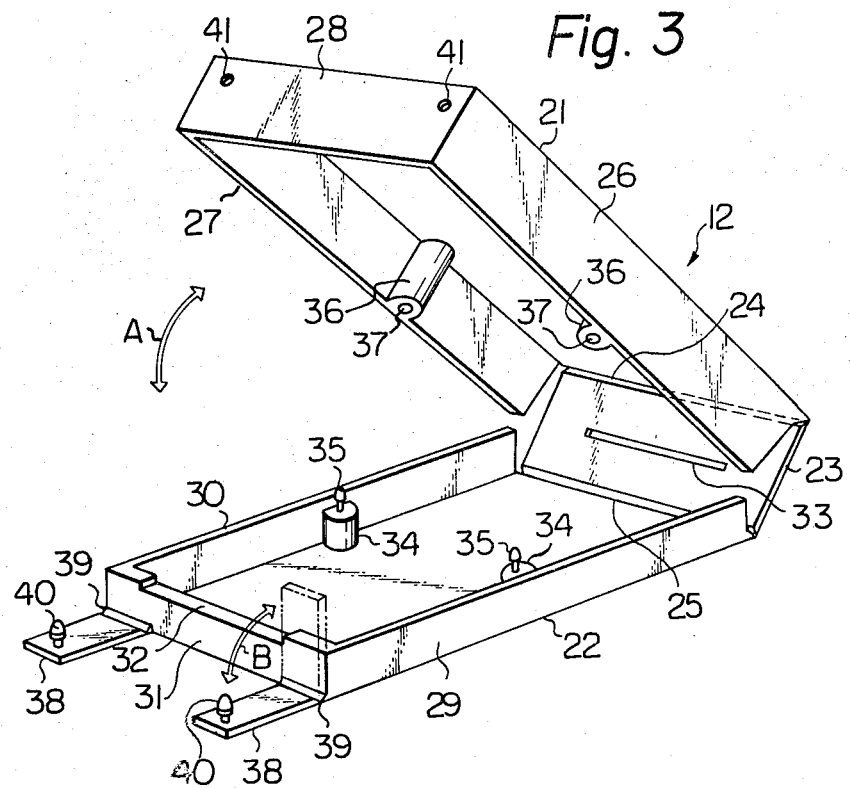
FIG. 3 is a perspective view of the cover illustrated in FIG. 2.
Figure 4:
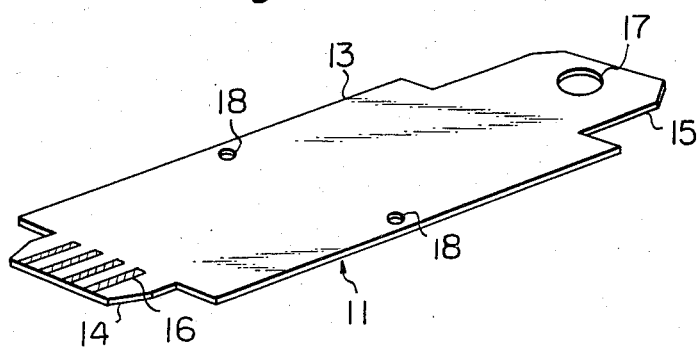
FIG. 4 is a perspective view of the printed circuit board unit illustrated in FIG. 2.

Referring to FIGS. 1 through 4, an electronic device designated generally by the reference numeral 10 comprises a printed circuit board unit 11 and a cover 12. As best illustrated in FIG. 4, the printed circuit board unit 11 includes a printed circuit board 13 on which a plurality of electronic elements (not shown) are mounted. The printed circuit board 13 has integral portions 14 and 15 at the opposed ends, respectively. The end portion 14 is provided with printed electrical terminals 16 so as to form an edge type electrical connector. The end portion 15 is formed with a hole 17 therein so as to provide a handle which is used for insertion and removal of the electronic device 10 with respect to a mounting chassis, as will be described hereinafter. The printed circuit board unit 11 is contained in or covered by the cover 12, with both the electrical connector 14 and the handle 15 being projected out of the cover, as illustrated in FIGS. 1 and 2.

The cover 12 is substantially rectangular parallelepiped in configuration in the assembled condition, as illustrated in FIG. 1, and is constructed from a single member of plastic material formed by moulding. The cover 12 has an upper cover portion 21, a lower cover portion 22 and an end wall portion 23, which are integrally connected via flexible connecting portions 24 and 25. The end wall portion 23 and the flexible connecting portions 24 and 25 serve as hinge means and permit pivotal movements of the upper and lower cover portions 21 and 22 with respect to each other, whereby the cover 12 can be opened and closed in the direction indicated by the arrow A in FIG. 3. To this end, the cover 12 is made of a material which ensures high flexibility of the connecting portions 24 and 25, such as polypropylene or the like, for example.

The upper cover portion 21 has formed at its free edges two side walls 26 and 27, and an end wall 28, and; the lower cover portion 22 has formed at its free edges two side walls 29 and 30, and an end wall 31. When the cover 12 is in the closed position, the walls 26, 27 and 28 and the walls 29, 30 and 31 of the respective upper and lower cover portions are brought into abutting engagement with each other, as partially illustrated in FIG. 5.

The end wall 31 of the lower cover portion 22 has a recess 32 formed on its upper edge, through which the electrical connector portion 14 of the printed circuit board unit 11 is projected out of the cover 12. On the other hand, the end wall portion 23 is formed with a slit 33 therein, through which the handle 15 of the printed circuit board unit 11 is projected out of the cover 12.

On the insides of the respective side walls 29 and 30 of the lower cover portion 22, there are formed supporting seats 34, which have locking pins 35 projecting perpendicularly from the seat surfaces. On the other hand, on the insides of the respective side walls 26 and 27, of the upper cover portion 21, there are formed supporting seats 36, which have holes 37 formed in the seat surfaces. The locking pins 35 and the holes 37 are adapted for snap engagement with each other, so as to retain the upper and lower cover portions 21 and 22 in the closed position. The printed circuit board 13 is formed with holes 18, through which the locking pins 35 pass loosely.

On the outside of the end wall 31 the lower cover portion 22 is provided with locking flaps 38, which are integrally connected to the end wall 31 via flexible hinge portions 39, and have locking pins 40 at the free end portion thereof. The hinge portions 39 are adapted to permit the locking flaps 38 to be pivotally moved, in the direction indicated by an arrow B in FIG. 3, between the unlocking position illustrated by solid lines and the locking position illustrated by phantom lines, at which locking position the locking pins 40 are perpendicular to the locking pins 35. On the other hand, the upper cover portion 21 has formed therein holes 41, which are adapted for snap engagement with the locking pins 40 so as to retain the upper and lower cover portions 21 and 22 in the closed position.

In assembling the electronic device 10, the printed circuit board unit 11 is initially put into the lower cover portion 22 of the cover 12, as illustrated in FIG. 2. This is effected by, firstly, inserting the handle 15 into the slit 33 so that the handle 15 projects beyond the end wall portion 23 and, then, putting the printed circuit board 13 on the supporting seats 34, with the locking pins 35 projecting through the holes 18, and also, with the electrical connector 14 being fitted in the recess 32 beyond the end wall 31. At this stage, the edges of three sides of the printed circuit board 13 abut against the insides of the side and end walls 29, 30 and 31, whereby the printed circuit board unit 11 is positioned in place.

Subsequently, the upper cover portion 21 of the cover 12 is closed and, then, the locking pins 35 and the corresponding holes 37 are respectively brought into snap engagement with each other, whereby the printed circuit board 13 is securely held between the seats 34 and 36, and also, the upper and lower cover portions 21 and 22 are retained in the closed position.

Finally, the locking flaps 38 are turned up so as to bring the locking pins 40 into snap engagement with the holes 41 in the upper cover portion 21, as illustrated in FIG. 1, which completes the assembling. It will be appreciated that the direction of insertion of the locking pins 40 into the holes 41 is perpendicular to the direction of insertion of the locking pins 35 into the holes 37. This assures that the cover 12 is positively retained in the closed position against various external force.

Furthermore, the upper and lower cover portions 21 and 22 may have formed along partial adjoining lengths or the overall adjoining lengths of the side walls 26, 27, 29 and 30 additional locking portions, an example of which is illustrated in FIG. 6 by the reference numerals 26a and 29a. These locking portions interlock when the upper and lower cover portions are closed, thereby ensuring an even more positive retaining of the cover in the closed position than the above described embodiment.

As will be apparent from the above description, the cover 12 is constructed from a single member, and can be easily and quickly assembled together with the printed circuit board unit in a one-touch locking manner without the use of fastening screws or the like.

Referring to FIGS. 7 and 8, the assembled electronic device 10 is set in a mounting chassis 50. The interior of the chassis 50 is divided by partitions 51 into a plurality of compartments 52, in each of which the electronic device 10 is set with the electrical connector 14 of the electronic device 10 in engagement with an electrical connector 53 disposed at the bottom of the compartment 52, for providing the electrical connection for the printed circuit board unit 11. When the electronic device 10 is inserted into the compartment 52, the outer walls of the cover 12 slide along the inner wall of the compartment so as to guide the electrical connector 14 with respect to the corresponding connector 53, thereby ensuring a smooth engagement between them. The engagement and disengagement between the connectors 14 and 53 is effected by using the handle 15. In this case, since both the electrical connector 14 and the handle 15 are integrally formed with the printed circuit board, the force applied to the handle 15 is transmitted via the printed circuit board to the connector 14, but is not applied to the cover 12. Accordingly, the engagement and disengagement of the electrical connector can be effected easily and accurately, and also, the cover can be made of a material having a low mechanical strength.

It will be appreciated from the above description that the present invention provides an electronic device which is constructed from a minimum number of separate elements, which facilitates fabrication and assembly and accordingly, is simple in construction and inexpensive to manufacture.

The invention has been described in detail with particular reference to preferred embodiments thereof, but it will be appreciated that various variations and modifications can be effected within the spirit and scope of the invention.

What we claim is:

1. An electronic device for use in a communication system unit, said unit including a mounting chassis having a plurality of compartments, each compartment comprising means for receiving said electronic device and an electrical connector for making electrical connection thereto, said electronic device comprising:
   a printed circuit board unit including a printed circuit board, said board being provided at one end with an integral electrical connector for engagement with said electrical connector of a respective one of said chassis compartments and at the opposite end with an integral handle for use for the insertion and removal of the electronic device into and from the chassis, and
   cover means for containing said printed circuit board unit with said electrical connector and said handle projecting out from said cover means, said cover means being adapted to serve as guide means for insertion of the electronic device into the respective mounting chassis compartment and for positioning said circuit board within said cover means, said cover means being constructed from a single member, said single member comprising first and second cover portions, flexible hinge means for permitting said cover portions to be pivotally moved with respect to each other between open and closed positions of said cover means, supporting seats formed on the inside of said cover portions for securely holding said printed circuit board unit when said cover means is in the closed position, and locking means for retaining said cover means in the closed position, said locking means comprises a locking pin formed on the supporting seats on one of said cover portions, each said locking pin being adapted to pass through a hole formed in the printed circuit board for snap engagement with a hole formed in the other supporting seat on the other of said cover portions when said cover means is in the closed position.

2. An electronic device according to claim 1, said locking means further comprising a locking flap formed on the outside of a first one of said cover portions and having a flexible hinge portion and a second locking pin, said flexible hinge portion being adapted to permit said locking flap to be pivotally moved with respect to said first cover portion between a locked position of said locking flap, in which locked position said second locking pin is in snap engagement with a second hole formed in the outside of the other of said cover portions when said cover means is in the closed position, and an unlocked position of said locking flap, the direction in which said locking pin on the supporting seat engages the corresponding hole being perpendicular to the direction in which said second locking pin of the locking flap engages said second hole.

3. An electronic device according to claim 1 or 2, said locking means comprising interlocking portions formed selectively along respective adjoining edges of said first and second cover portions.

4. An electronic device according to claim 1 said electrical connector being of the edge type.

5. An electronic device according to claim 1, said handle being constructed from an integral end portion of said printed circuit board and having a hole therein.

6. An electronic device according to claim 1, said cover member comprising moulded plastic material.

7. The device of claim 1, said cover member comprising polypropylene.

8. The device of claim 1, said cover means for positioning said circuit board comprising said locking pins passing through said holes in said circuit board in said closed position of said cover means.

* * * * *

UNITED STATES PATENT AND TRADEMARK OFFICE
CERTIFICATE OF CORRECTION

PATENT NO. : 4,226,491

DATED : October 7, 1980

INVENTOR(S) : Kazama et al

It is certified that error appears in the above—identified patent and that said Letters Patent is hereby corrected as shown below:

```
Cover page, Item [30], please delete "[U]".
Column 2, line 18, ", and;" should be --; and,--;
          line 62, ", and;" should be --; and,--.
Column 6, line 14, after "1" insert --,--.
```

Signed and Sealed this

Twenty-fourth Day of March 1981

[SEAL]

Attest:

RENE D. TEGTMEYER

Attesting Officer     Acting Commissioner of Patents and Trademarks